(12) United States Patent
Snodgrass et al.

(10) Patent No.: US 6,273,966 B1
(45) Date of Patent: Aug. 14, 2001

(54) HIGH PERFORMANCE RARE EARTH-TRANSITION METAL MAGNETOSTRICTIVE MATERIALS

(75) Inventors: Jonathan D. Snodgrass, Des Moines; O. Dale McMasters, Ames, both of IA (US)

(73) Assignee: Etrema Products, Inc., Ames, IA (US)

( * ) Notice: Subject to any disclaimer, the term of this patent is extended or adjusted under 35 U.S.C. 154(b) by 0 days.

(21) Appl. No.: 09/204,871

(22) Filed: Dec. 3, 1998

(51) Int. Cl.[7] .................................................. H01F 1/053
(52) U.S. Cl. ............................................ 148/301; 148/303
(58) Field of Search ..................................... 148/301, 303

(56) References Cited

U.S. PATENT DOCUMENTS

| | | |
|---|---|---|
| 4,308,474 | 12/1981 | Savage et al. . |
| 4,609,402 | 9/1986 | McMasters . |
| 4,770,704 | 9/1988 | Gibson et al. . |
| 4,818,304 | 4/1989 | Verhoeven et al. . |
| 4,849,034 | 7/1989 | Verhoeven et al. . |
| 5,087,291 | * 2/1992 | Schmidt et al. ........................ 75/581 |
| 5,110,376 | 5/1992 | Kobayashi et al. . |
| 5,223,046 | 6/1993 | Kobayashi et al. . |
| 5,529,745 | 6/1996 | Mori et al. . |

FOREIGN PATENT DOCUMENTS 0 827 219 A2  *  3/1998  (EP) .

OTHER PUBLICATIONS

D.T. Peterson et al., "Strength of Terfenol–D," (May 1, 1989) J. Appl. Phys. 65(9), pp. 3712–3713.

* cited by examiner

Primary Examiner—John Sheehan
(74) Attorney, Agent, or Firm—Flehr Hohbach Test Albritton & Herbert LLP

(57) ABSTRACT

A high performance rare earth-transition metal magnetostrictive material with increased impurities having the formula $(R_{x1}R_{x2} \ldots R_{x11})_1(M_{y1}M_{y2} \ldots M_{y6})_z$ is provided. Each R is selected from the group of elements consisting of lanthanum, cerium, praseodymium, neodymium, samarium, gadolinium, terbium, dysprosium, holmium, erbium and yttrium, where $0 \leq x1 \leq 1, 0 \leq x2 \leq 1 \ldots 0 \leq x11 \leq 1$ and where $x1+x2+ \ldots +x11=1$. Each M is selected from the group of elements consisting of iron, manganese, cobalt, nickel, aluminum and silicon, where $0 \leq y1 \leq 1, 0 \leq y2 \leq 1 \ldots 0 \leq y6 \leq 1$, where $y1+y2+ \ldots +y6=1$ and where $1.8 \leq z \leq 2.1$. The material has oxygen impurities, nitrogen impurities and carbon impurities. The oxygen impurities having an atomic percent ranging from 6,011 to 34,000 parts per million. The nitrogen impurities having an atomic percent ranging from 575 to 4,400 parts per million. The carbon impurities having an atomic percent ranging from 939 to 21,000 parts per million. The material exhibits acceptable magnetostrictive strain performance at a reduced cost.

18 Claims, 5 Drawing Sheets

| DATA POINT | OXYGEN IMPURITY (ATOMIC ppm) | NITROGEN IMPURITY (ATOMIC ppm) | CARBON IMPURITY (ATOMIC ppm) | AGGREGATE IMPURITIES (ATOMIC ppm) | MAGNETO-STRICTIVE STRAIN (ppm) |
|---|---|---|---|---|---|
| 1 | 2733 | 225 | 571 | 3529 | 1125 |
| 2 | 4032 | 370 | 525 | 4928 | 1106 |
| 3 | 4200 | 484 | 392 | 5076 | 1106 |
| 4 | 5105 | 456 | 2412 | 7973 | 1080 |
| 5 | 6555 | 682 | 1744 | 8980 | 1062 |

*FIG. 1*

HIGH PERFORMANCE RARE EARTH-TRANSITION METAL MAGNETOSTRICTIVE MATERIALS

This invention pertains to high performance magnetostrictive materials and, more particularly, to rare earth-transition metal giant magnetostrictive materials.

Rare earth-transition metal magnetostrictive materials have heretofore been provided. See, for example, U.S. Pat. No. 4,308,474. Methods for the manufacture of rare earth-transition metal magnetostrictive materials have also been provided. See, for example, U.S. Pat. Nos. 4,609,402, 4,770,704, 4,849,034 and 4,818,304. Current production methods for such giant magnetostrictive materials have required relatively low levels of impurities to ensure that the resultant alloy has suf f icient toughness for withstanding normal handling. For example, at least one manufacturer of such giant magnetostrictive materials has required that the rare earth starting materials have oxygen, nitrogen and carbon impurity levels of not greater than 6,011, 575 and 939, parts per million, respectively. There is, however, a need for a less expensive magnetostrictive material which exhibits a high level of magnetostrictive strain.

In general, it is an object of the present invention to provide a new and improved giant magnetostrictive material or alloy which provides a high level of magnetostrictive strain despite increased amounts of impurities in the raw materials for producing the alloy at a reduced cost.

Another object of the invention is to provide a giant magnetostrictive material of the above character having increased amounts of oxygen, nitrogen and carbon impurities in the raw materials.

Additional objects and features of the invention will appear from the following description from which the preferred embodiments are set forth in detail in conjunction with the accompanying drawings.

FIG. 1 is a table showing impurity levels in the rare earth starting materials of five test batches and the average magnetostrictive strain in the five test batches produced thereby.

Figure 2:
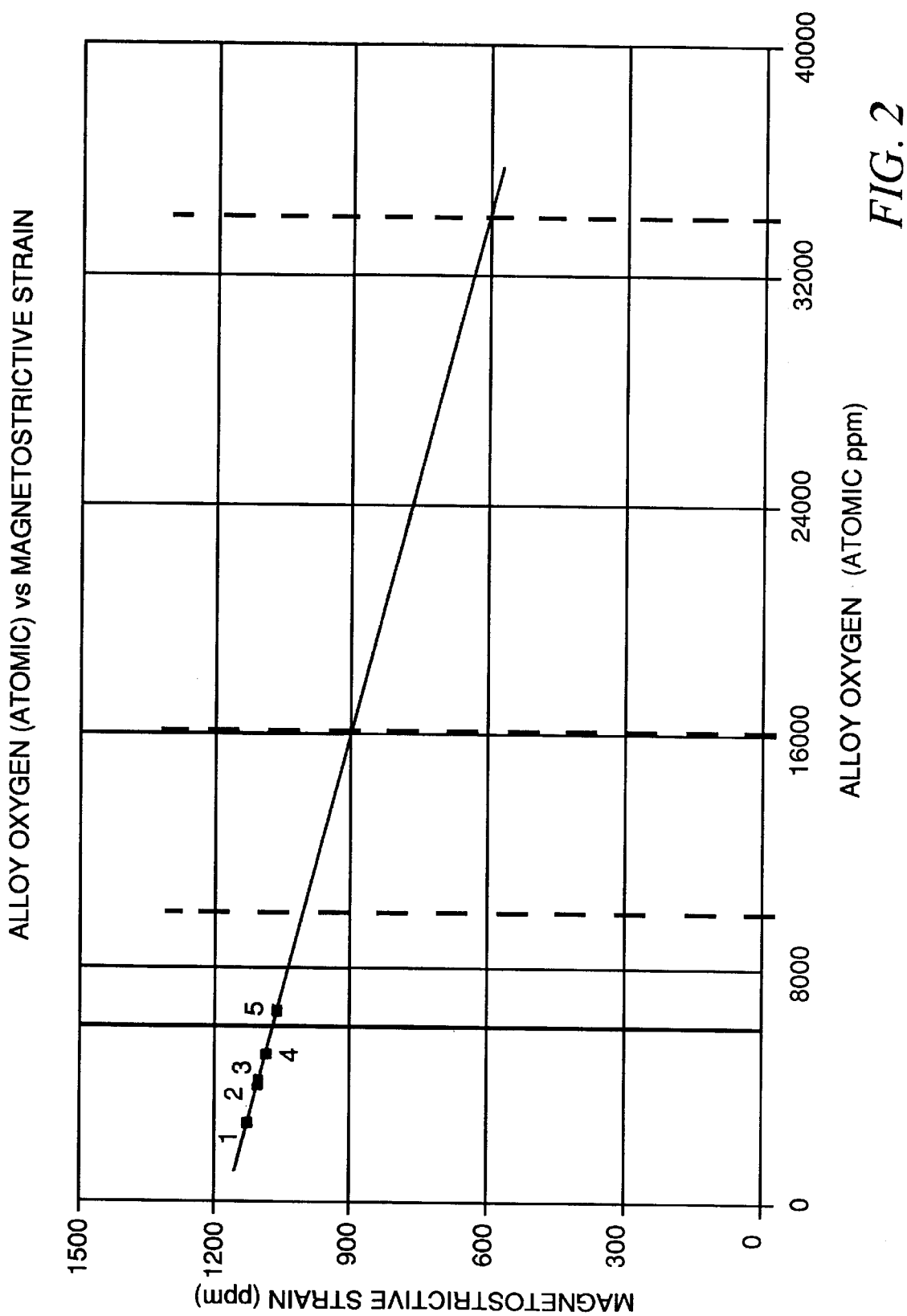
FIG. 2 is a graph created from the data from FIG. 1 showing magnetostrictive strain versus oxygen impurity level in the alloy.
Figure 3:
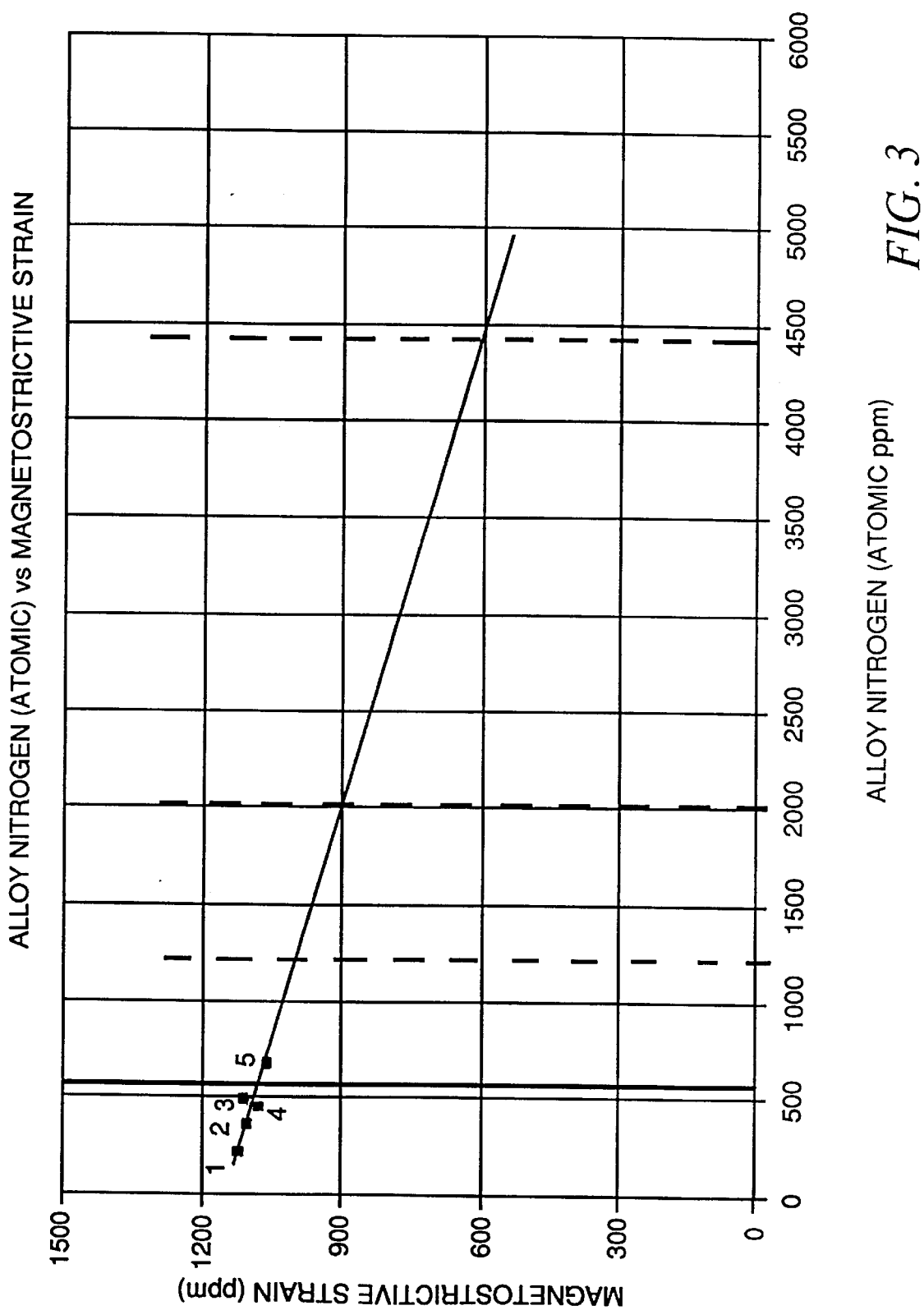
FIG. 3 is a graph created from the data from FIG. 1 showing magnetostrictive strain versus nitrogen impurity level in the alloy.

In general, a rare earth-transition metal magnetostrictive material or alloy with increased impurities having the formula $(R_{x1}R_{x2} \ldots R_{x11})_1(M_{y1}M_{y2} \ldots M_{y6})_z$ is provided. Each R in the formula is selected from the group of elements consisting of lanthanum, cerium, praseodymium, neodymium, samarium, gadolinium, terbium, dysprosium, holmium, erbium and yttrium, where $0 \leq x1 \leq 1$, $0 \leq x2 \leq 1 \ldots 0 \leq x11 \leq 1$ and where $x1+x2+ \ldots +x11=1$. Each M in the formula is selected from the group of elements consisting of iron, manganese, cobalt, nickel, aluminum and silicon, where $0 \leq y1 \leq 1$, $0 \leq y2 \leq 1 \ldots 0 \leq y6 \leq 1$, where $y1+y2+ \ldots +y6=1$ and where $1.8 \leq z \leq 2.1$. The material has oxygen impurities, nitrogen impurities and carbon impurities. The oxygen impurities have an atomic percent ranging from 6,011 to 34,000 parts per million. The nitrogen impurities have an atomic percent ranging from 575 to 4,400 parts per million. The carbon impurities have an atomic percent ranging from 939 to 21,000 parts per million. The material exhibits acceptable magnetostrictive strain performance at a reduced cost.

More in particular, the low cost rare earth-transition magnetostrictive material or alloy of the present invention has the formula $(R_{x1}R_{x2} \ldots R_{x11})_1(M_{y1}M_{y2} \ldots M_{y6})_z$ where each R is a rare earth element, preferably either lanthanum (La), cerium (Ce), praseodymium (Pr), neodymium (Nd), samarium (Sm), gadolinium (Gd), terbium (Tb), dysprosium (Dy), holmium (Ho), erbium (Er) or yttrium (Y). Any combination of these elements can be provided in said formula, as will be understood by the examples set forth below. In said formula, $0 \leq x1 \leq 1$, $0 \leq x2 \leq 1 \ldots 0 \leq x11 \leq 1$, that is, $0 \leq x1 \leq 1$, $0 \leq x2 \leq 1$, $0 \leq x3 \leq 1$, $0 \leq x4 \leq 1$, $0 \leq x5 \leq 1$, $0 \leq x6 \leq 1$, $0 \leq x7 \leq 1$, $0 \leq x8 \leq 1$, $0 \leq x9 \leq 1$, $0 \leq x10 \leq 1$ and $0 \leq x11 \leq 1$. In addition, $x1+x2+ \ldots +x11=1$, that is, $x1+x2+x3+x4+x5+x6+x7+x8+x9+x10+x11=1$. The composition of the rare earth atoms provides for the anisotropy of magnetostriction, the property which yields the giant magnetostrictive response of the alloy.

Each M in said formula is a transition metal or metalloid and preferably one of the following elements: iron (Fe), manganese (Mn), cobalt (Co), nickel (Ni), aluminum (Al) or silicon (Si). As will be understood by the examples set forth below, any combination of these elements can be provided in said formula. In the formula, $0 \leq y1 \leq 1$, $0 \leq y2 \leq 1 \ldots 0 \leq y6 \leq 1$, that is, $0 \leq y1 \leq 1$, $0 \leq y2 \leq 1$, $0 \leq y3 \leq 1$, $0 \leq y4 \leq 1$, $0 \leq y5 \leq 1$ and $0 \leq y6 \leq 1$. In addition, $y1+y2+ \ldots +y6=1$, that is, $y1+y2+y3+y4+y5+y6=1$, and $1.8 \leq z \leq 2.1$. The composition of the transition metals and/or metalloids in the final alloy affect the magnetic properties of the alloy allowing for optimization of the alloy to a wide variety of uses.

An alternative formula for the giant magnetostrictive material of the present invention is $R_1M_z$, where R is $La_{x1}Ce_{x2}Pr_{x3}Nd_{x4}Sm_{x5}Gd_{x6}Tb_{x7}Dy_{x8}Ho_{x9}Er_{x10}Y_{x11}$ and M is $Fe_{y1}Mn_{y2}Co_{y3}Ni_{y4}Al_{y5}Si_{y6}$. In said alternate formula, $0 \leq x1 \leq 1$, $0 \leq x2 \leq 1$, $0 \leq x3 \leq 1$, $0 \leq x4 \leq 1$, $0 \leq x5 \leq 1$, $0 \leq x6 \leq 1$, $0 \leq x7 \leq 1$, $0 \leq x8 \leq 1$, $0 \leq x9 \leq 1$, $0 \leq x10 \leq 1$ and $0 \leq x11 \leq 1$ and $x1+x2+x3+x4+x5+x6+x7+x8+x9+x10+x11=1$. In addition, $0 \leq y1 \leq 1$, $0 \leq y2 \leq 1$, $0 \leq y3 \leq 1$, $0 \leq y4 \leq 1$, $0 \leq y5 \leq 1$, $0 \leq y6 \leq 1$. Further, $y1+y2+y3+y4+y5+y6=1$ and $1.8 \leq z \leq 2.1$. As can be seen, R in said alternate formula is one or more of a group of rare earth elements, preferably one or more of the elements lanthanum, cerium, praseodymium, neodymium, samarium, gadolinium, terbium, dysprosium, holmium, erbium and yttrium. M in said alternate formula is one or more of a group of transition metals or metalloids and preferably one or more of the elements iron, manganese, cobalt, nickel, aluminum and silicon.

A particularly preferred formula of the giant magnetostrictive material of said formula and said alternate formula is $(Tb_xDy_{1-x})_1Fe_{1.8-2.1}$, where $0 \leq x \leq 1$. Such particularly preferred giant magnetostrictive material is commonly referred to as TERFENOL-D. Without limiting the generality of said formula or said alternate formula, other materials or alloys included in said formula and said alternate formula include:

$(Sm_{x1}Dy_{1-x1})_1Fe_{1.8-2.1}$, where $0 \leq x1 \leq 1$;

$(Tb_{x1}Dy_{1-x1-x2}Ho_{x2})_1Fe_{1.8-2.1}$, where $0 \leq x1 \leq 1$, $0 \leq x2 \leq 1$ and $x1+x2 \leq 0.5$;

$(Sm_{x1}Ho_{1-x1})_1Fe_{1.8-2.1}$, where $0 \leq x1 \leq 1$;

$(Sm_{x1}Ho_{1-x1})_1(Co_{y1}Fe_{1-y1})_{1.8-2.1}$, where $0 \leq x1 \leq 1$ and $0 \leq y1 \leq 1$;

$(Tb_{x1}Dy_{1-x1})_1(Mn_{y1}Fe_{1-y1})_{1.8-2.1}$, where $0 \leq x1 \leq 1$ and $0 \leq y1 \leq 0.5$;

$(Tb_{x1}Dy_{1-x1})_1(Co_{y1}Fe_{1-y1})_{1.8-2.1}$, where $0 \leq x1 \leq 1$ and $0 \leq y1 \leq 1$;

$(Tb_{x1}Dy_{1-x1})_1(Ni_{y1}Fe_{1-y1})_{1.8-2.1}$, where $0 \leq x1 \leq 1$ and $0 \leq y1 \leq 1$;

$(Tb_{x1}Dy_{1-x1})_1(Al_{y1}Fe_{1-y1})_{1.8-2.1}$, where $0 \leq x1 \leq 1$ and $0 \leq y1 \leq 0.1$;

$(Tb_{x1}Dy_{1-x1})_1(Al_{y1}Mn_{y2}Fe_{1-y1-y2})_{1.8-2.1}$, where $0 \leq x1 \leq 1$, $0 \leq y1 \leq 0.1$ and $0 \leq y2 \leq 0.5$;

$(Tb_{x1}Dy_{1-x1-x2}Ho_{x2})_1(Al_{y1}Fe_{1-y1})_{1.8-2.1}$, where $0 \leq x1 \leq 1$, $0 \leq x2 \leq 0.5$, $x1+x2 \leq 1$ and $0 \leq y1 \leq 0.1$;

$(Tb_{x1}Dy_{1-x1})_1(Co_{y1}Mn_{y2}Fe_{1-y1-y2})_{1.8-2.1}$, where $0 \leq x1 \leq 1$, $0 \leq y1 \leq 1$, $0 \leq y2 \leq 0.5$ and $y1+y2 \leq 1$; and $(Tb_{x1}Dy_{1-x1-x2}Ho_{x2})_1(Co_{y1}Mn_{y2}Fe_{1-y1-y2})_{1.8-2.1}$, where $0 \leq x1 \leq 1$, $0 \leq x2 \leq 0.5$, $x1+x2 \leq 1$, $0 \leq y1 \leq 1$, $0 \leq y2 \leq 0.5$ and $y1+y2 \leq 1$.

The giant magnetostrictive materials or alloys of the present invention can be prepared by any of the known methods for forming magnetostrictive materials, including but not limited to the free standing zone melt method, the Bridgman or modified Bridgman methods, the sintered powder processing method and the Czochralski crystal growth technique, and can be compounded into polymer matrix composites or metal matrix composites. Each of the materials or alloys has a magnetostrictive strain when so prepared to produce an aligned crystalline or polycrystalline structure to exploit the anisotropy of magnetostriction of the material so as to yield an optimized macroscopic change in length in response to an applied magnetic field.

The materials or alloys of the present invention each have oxygen impurities, nitrogen impurities and carbon impurities. As can be appreciated by those skilled in the art of magnetostrictive materials, each of such materials or alloys consists of a (Rare Earth)$_1$(Metal)$_2$ intermetallic compound phase that crystallizes in the $R_1M_2$ Laves phase C15 type structure and a rare earth rich eutectic phase. It was previously thought that the oxygen, nitrogen and carbon impurities present in the raw materials used to produce the alloys would most likely be located in the form of thermodynamically stable compounds within the rare earth-rich eutectic phase of the final alloy as dispersed particles. Since the eutectic phase of magnetostrictive alloys is known to be the primary strengthening mechanism for this alloy system, the presence of these particles within the eutectic phase was thought to interfere with this strengthening mechanism and thus significantly reduce the toughness of the final alloy. The mechanism of magnetostriction in the final alloy is tied to magnetic domain wall movement in the (Rare Earth)$_1$(Transition Metal)$_2$ phase. It was thus believed that the concentration of the impurities in the eutectic phase would not impact the magnetostrictive performance of the material.

Recent advances in the control of the production processes for the manufacture of giant magnetostrictive alloys have enabled a better resolution of the impact of various process variables, including the starting impurity levels within the raw materials used to produce the alloys. The relationship of the magnetostrictive strain of TERFENOL-D to the oxygen, nitrogen and carbon impurity levels in the rare earth starting materials for making TERFENOL-D is shown in FIGS. 1–5. Five data points are shown in each of FIGS. 1–5 and corresponding data points are labeled by corresponding numbers in the figures.

As can be seen most clearly from FIGS. 2–5, the magnetostrictive strain of the final alloy is reduced as the level of oxygen, nitrogen and carbon impurities in the raw materials is increased. This reduction in magnetostrictive performance as a function of impurity content indicates that these impurities must be located in the (Rare Earth)$_1$(Metal)$_2$ phase and not concentrated primarily in the rare earth-rich eutectic phase of the final alloy. The presence of these additional particles within the (Rare Earth)$_1$(Metal)$_2$ phase inhibits the performance of the final alloy due to pinning of magnetic domain walls by these particles, which restricts wall motion. Thus, the amount of magnetostrictive strain produced in such a final alloy by a given input drive magnetic field is lower when compared to the amount of magnetostrictive strain of a comparable magnetostrictive alloy having lower levels of impurities and being driven by the same input drive magnetic field.

The discovery that oxygen, nitrogen and carbon impurities are not concentrated only in the eutectic phase of magnetostrictive alloys allows the levels of these impurities to be relaxed without adversely affecting toughness of the final alloys. The correlation of these impurities, both individually and combined, to the amount of magnetostrictive strain produced by the alloys permits raw materials having greater oxygen, nitrogen and carbon impurities than previously allowed to be used for the manufacture of magnetostrictive alloys having optimum strain performance. The relaxation of impurity levels in the raw materials can substantially reduce the cost of the raw materials and thus the cost of the final alloys.

Figure 4:
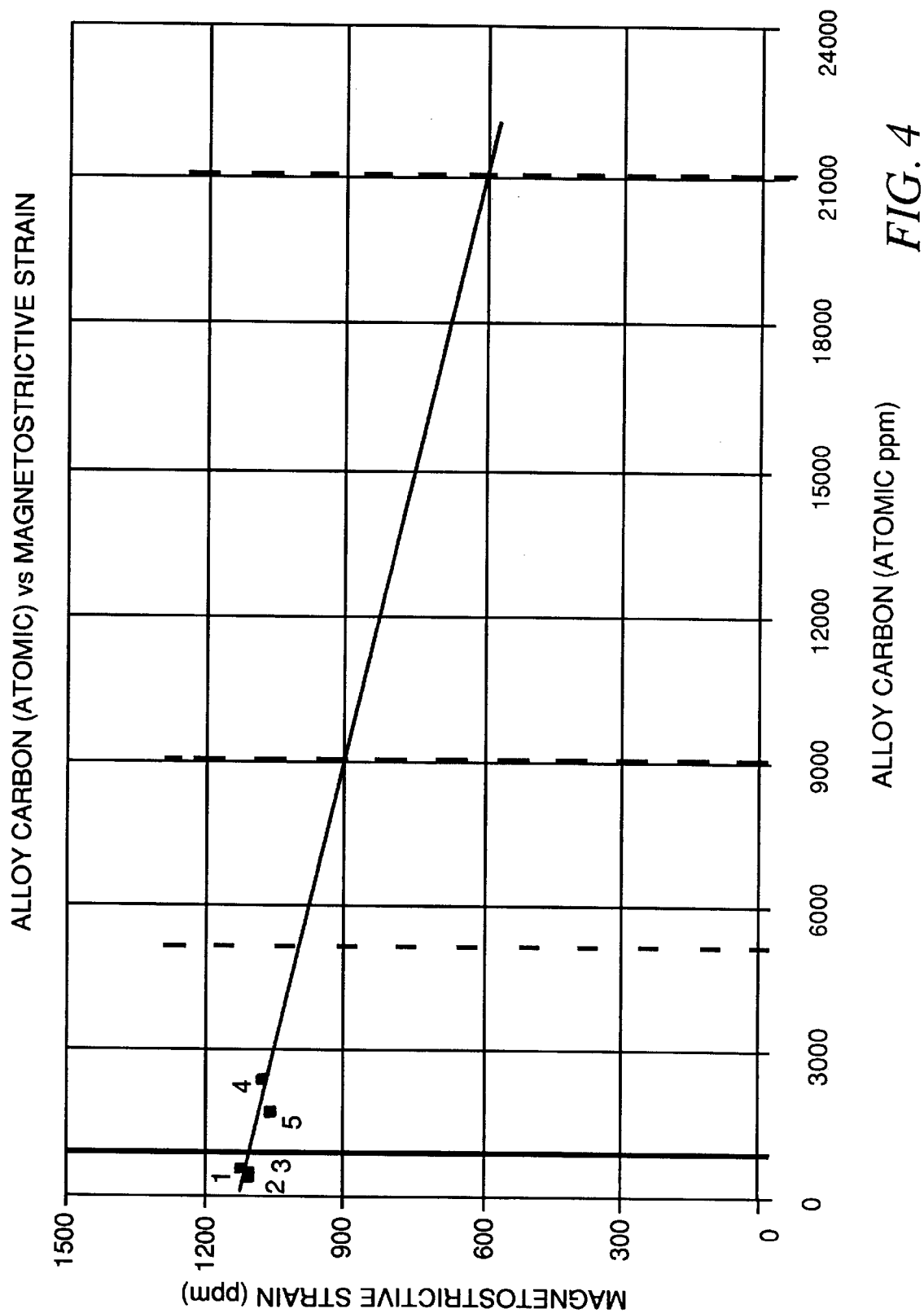
FIG. 4 is a graph created from the data from FIG. 1 showing magnetostrictive strain versus carbon impurity level in the alloy.
Figure 5:
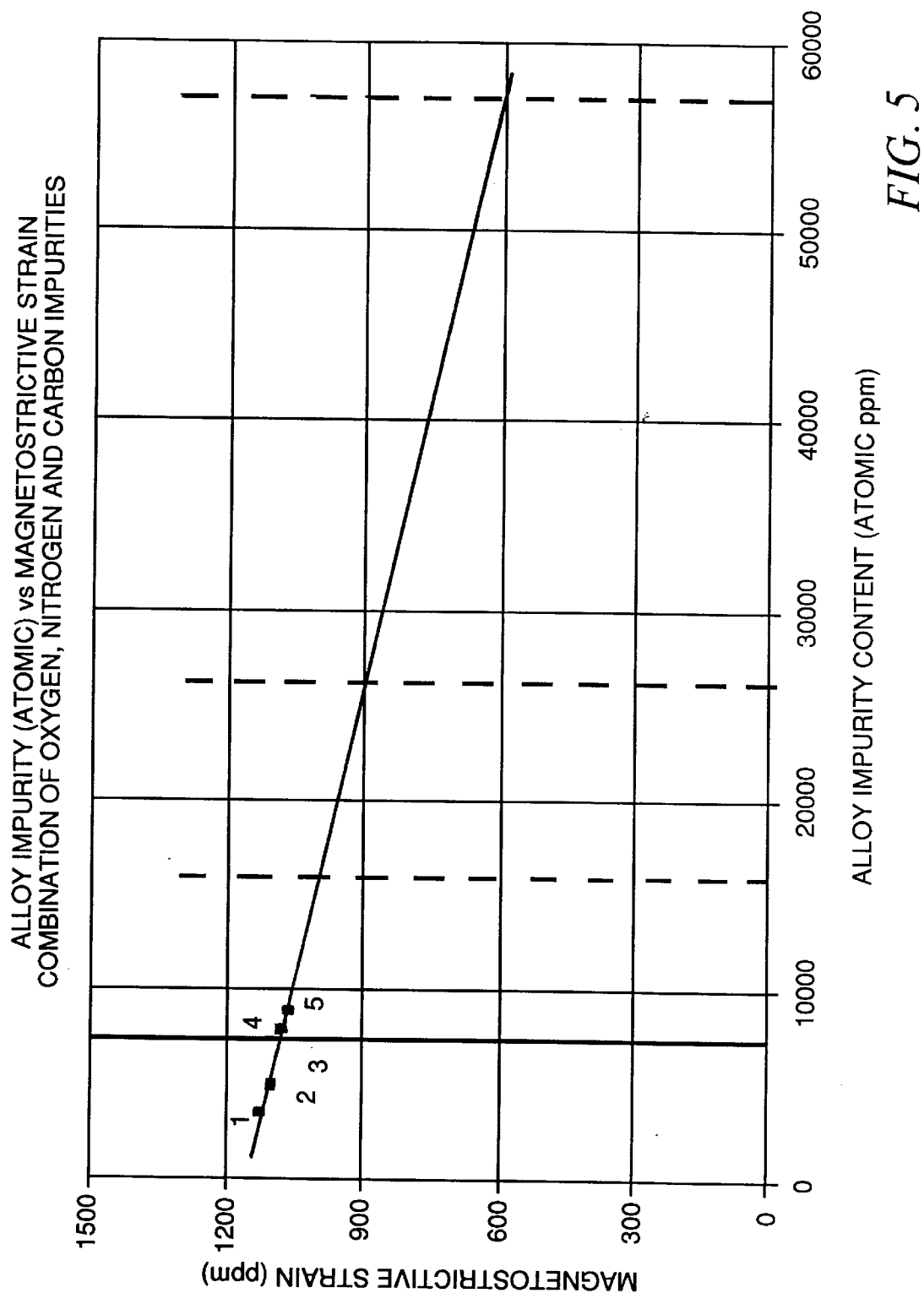
FIG. 5 is a graph created from the data from FIG. 1 showing magnetostrictive strain versus aggregate oxygen, nitrogen and carbon impurity levels in the alloy.

The materials or alloys of the present invention have oxygen impurities having an atomic percent of at least 6,011 parts per million and preferably ranging from 6,011 to 34,000 parts per million, nitrogen impurities of at least 575 parts per million and preferably ranging from 575 to 4,400 parts per million and carbon impurities of at least 939 parts per million and preferably ranging from 939 to 21,000 parts per million (see FIGS. 2–4), and aggregate impurity levels of oxygen, nitrogen and carbon of at least 7,525 parts per million and preferably ranging from 7,525 to 59,400 parts per million (see FIG. 5). Within such preferred ranges, various further preferred ranges exist.

One further preferred range calls for oxygen impurities having an atomic percent ranging from 10,000 to 16,000 parts per million, nitrogen impurities ranging from 1,200 to 2,000 parts per million and carbon impurities ranging from 4,800 to 9,000 parts per million, and aggregate impurity levels of oxygen, nitrogen and carbon ranging from 16,000 to 27,000 parts per million. Alloys produced within these ranges exhibit optimum magnetostrictive strain performance, and can be generated with a significant savings of 50–70% in comparison to currently produced magnetostrictive alloys. Optimum magnetostrictive strain performance when prepared by the free standing zone melt method is defined as not less than 900 parts per million measured when a magnetic field of 500 oersteds is applied to the material and the material is under a compressive prestress of 1000 pounds per square inch. Optimum magnetostrictive strain performance for an alloy prepared by the Bridgman or modified Bridgman methods is defined as not less than 600 parts per million measured when a magnetic field of 500 oersteds is applied to the material and the material is under a compressive prestress of 1000 pounds per square inch.

Another further preferred range calls for oxygen impurities having an atomic percent ranging from 6,011 to 10,000 parts per million, nitrogen impurities ranging from 575 to 1,200 parts per million and carbon impurities ranging from 939 to 4,800 parts per million, and aggregate impurity levels of oxygen, nitrogen and carbon ranging from 7,525 to 16,000 parts per million. Alloys produced within these ranges exhibit better than optimum magnetostrictive strain performance, with a 10–20% manufacturing cost reduction in comparison to currently produced magnetostrictive alloys.

Yet another further preferred range calls for oxygen impurities having an atomic percent ranging from 16,000 to 34,000 parts per million, nitrogen impurities ranging from 2,000 to 4,400 parts per million and carbon impurities ranging from 9,000 to 21,000 parts per million, and aggregate impurity levels of oxygen, nitrogen and carbon ranging from 27,000 to 59,400 parts per million. Alloys produced within these ranges exhibit less than optimum but competitive magnetostrictive strain performance, with a 70–90% manufacturing cost reduction in comparison to currently produced magnetostrictive alloys.

The impurity ranges called for in the alloys of the present invention were generated from five data points obtained from five test batches of 10–14 samples of material, each produced with rare earth starting materials having increased amounts of oxygen, nitrogen and carbon impurities. In order to eliminate noise, or scatter, in the collected data and to determine if there was any correlation between the impurity levels in the alloy material and the resulting strain performance, the general data set was refined to these five batches to include samples produced under identical conditions except for the impurity levels in their starting materials. The conditions held fixed during production included the method of crystal growth, system operator, sample diameter, sample length and test fixtures used to measure the material. The general data set was also refined to cover a short period of time so that the general state of the manufacturing equipment was kept constant. Each data point represents information obtained from a cluster of samples produced from a known combination of starting materials, the data point being at the average impurity level for such cluster of samples. The average strain performance for such average impurity level is indicated by a single data point for each such cluster of samples.

FIGS. 1–5 show that the aggregate amount of oxygen, nitrogen and carbon impurities in the rare earth starting materials, and hence the magnetostrictive alloy produced thereby, affect the magnetostrictive strain performance of the resulting alloy. In addition, the individual impurity levels of oxygen, nitrogen and carbon in the starting materials each have an impact on the strain performance of the magnetostrictive material. With respect to oxygen, the strong correlation between oxygen impurity levels and strain performance, as seen in FIG. 2, and the substantially larger presence of oxygen relative to nitrogen and carbon impurities, supports the conclusion that the oxygen impurity level in the rare earth starting materials affects the strain performance of the resulting magnetostrictive alloy.

With respect to nitrogen and carbon, it can be seen from FIGS. 1 and 5 that the materials of data points 2 and 3 have very similar strain performance levels and very similar impurity levels. However, although both such materials have very similar oxygen levels (see FIGS. 1–2), the material of data point 2 has a lower amount of nitrogen and a higher amount of carbon than the material of data point 3 (see FIGS. 1 and 3–4). This correlation indicates that the nitrogen impurity level and the carbon impurity level of the rare earth starting materials each have an impact on the strain performance of the magnetostrictive material product and, more specifically, each have a similar impact on strain performance.

In comparing data point 4 to data points 2 and 3, it can be seen from FIGS. 1–2 that the material of data point 4 has only a slightly greater amount of oxygen impurities than the materials of data points 2 and 3, and from FIGS. 1 and 4 that the material of data point 4 has a greatly increased amount of carbon impurity relative to the material of data points 2 and 3. FIGS. 1 and 5 show that the material of data point 4 has a lower strain performance than the material of data points 2 and 3. The foregoing supports the conclusion that the strain performance of the magnetostrictive material is not dictated solely by the amount of oxygen impurity, since the amount of strain degradation is not in proportion to the change in the amount of oxygen impurity alone, but is proportional to the overall change in the total impurity level.

The individual impact of oxygen, nitrogen and carbon impurities on strain performance can be generalized to reflect the total impurity level of these elements, as evidenced by a comparison of data point 1 to data point 5. The material of data point 5 contained three times as much nitrogen (see FIGS. 1 and 3), two and one-half times as much oxygen (see FIGS. 1–2) and three times as much carbon (see FIGS. 1 and 4) as the material of data point 1. FIG. 5 shows that the strain performance of the material of data point 5 is reduced when compared to the material of data point 1, such reduction being in proportion to the total amount of oxygen, nitrogen and carbon impurities present and relatively proportional to the individual amounts of these impurities.

It can be seen from FIGS. 1–5 that a moderate increase in impurity levels in the rare earth starting materials results in only a small reduction in strain performance. Such moderate increase in impurity levels is expected to result in substantial cost reductions in the rare earth starting materials and hence resulting magnetostrictive alloy. A slightly greater increase in impurity levels in the rare earth starting materials results in a greater reduction in strain performance, but a significant reduction in cost. A further increase in such impurity levels further reduces strain performance, but also results in substantial reductions in the manufacturing cost.

From the foregoing, it can be seen that a new and improved giant magnetostrictive material has been provided which provides a high level of magnetostrictive strain despite increased amounts of impurities in the raw materials for producing the alloy at a reduced cost. Specifically, the giant magnetostrictive material has increased amounts of oxygen, nitrogen and carbon impurities in the raw materials.

What is claimed is:

1. A rare earth-transition metal magnetostrictive material having the formula $(R_{x1}R_{x2} \ldots R_{x11})_1(M_{y1}M_{y2} \ldots M_{y6})_z$ wherein each R is selected from the group of elements consisting of lanthanum, cerium, praseodymium, neodymium, samarium, gadolinium, terbium, dysprosium, holmium, erbium and yttrium, where $0 \leq x1 \leq 1$, $0 \leq x2 \leq 1 \ldots 0 \leq x11 \leq 1$ and where $x1+x2+ \ldots +x11=1$, and each M is selected from the group of elements consisting of iron, manganese, cobalt, nickel, aluminum and silicon, where $0 \leq y1 \leq 1$, $0 \leq y2 \leq 1 \ldots 0 \leq y6 \leq 1$, where $y1+y2+ \ldots +y6=1$ and where $1.8 \leq z \leq 2.1$, the material having a magnetostrictive strain that produces an aligned crystalline or polycrystalline structure to exploit the anisotropy of magnetostriction of the material to yield an optimized macroscopic change in length in response to an applied magnetic field, the material having an atomic percent of oxygen ranging from 6,011 to 34,000 parts per million, an atomic percent of nitrogen ranging from 575 to 4,400 parts per million and an atomic percent of carbon ranging from 939 to 21,000 parts per million.

2. A material as in claim 1 having the formula $(Sm_{x1}Dy_{1-x1})_1Fe_{1.8-2.1}$ wherein $0 \leq x1 \leq 1$.

3. A material as in claim 1 having the formula $(Tb_{x1}Dy_{1-x1-x2}Ho_{x2})_1Fe_{1.8-2.1}$ wherein $0 \leq x1 \leq 1$, $0 \leq x2 \leq 0.5$ and $x1+x2 \leq 1$.

4. A material as in claim 1 having the formula $(Sm_{x1}Ho_{1-x1})_1Fe_{1.8-2.1}$ wherein $0 \leq x1 \leq 1$.

5. A material as in claim 1 having the formula $(Sm_{x1}Ho_{1-x1})_1(Co_{y1}Fe_{1-y1})_{1.8-2.1}$ wherein $0 \leq x1 \leq 1$ and $0 \leq y1 \leq 1$.

6. A material as in claim 1 having the formula $(Tb_{x1}Dy_{1-x1})_1(Mn_{y1}Fe_{1-y1})_{1.8-2.1}$ wherein $0 \leq x1 \leq 1$ and $0 \leq y1 \leq 0.5$.

7. A material as in claim 1 having the formula $(Tb_{x1}Dy_{1-x1})_1(Co_{y1}Fe_{1-y1})_{1.8-2.1}$ wherein $0 \leq x1 \leq 1$ and $0 \leq y1 \leq 1$.

8. A material as in claim 1 having the formula $(Tb_{x1}Dy_{1-x1})_1(Ni_{y1}Fe_{1-y1})_{1.8-2.1}$ wherein $0 \leq x1 \leq 1$ and $0 \leq y1 \leq 1$.

9. A material as in claim 1 having the formula $(Tb_{x1}Dy_{1-x1})_1(Al_{y1}Fe_{1-y1})_{1.8-2.1}$ wherein $0 \leq x1 \leq 1$ and $0 \leq y1 \leq 0.1$.

10. A material as in claim 1 having the formula $(Tb_{x1}Dy_{1-x1})_1(Al_{y1}Mn_{y2}Fe_{1-y1-y2})_{1.8-2.1}$ wherein $0 \leq x1 \leq 1$, $0 \leq y1 \leq 0.1$ and $0 \leq y2 \leq 0.5$.

11. A material as in claim 1 having the formula $(Tb_{x1}Dy_{1-x1-x2}Ho_{x2})_1(Al_{y1}Fe_{1-y1})_{1.8-2.1}$ wherein $0 \leq x1 \leq 1$, $0 \leq x2 \leq 0.5$, $x1+x2 \leq 1$ and $0 \leq y1 \leq 0.1$.

12. A material as in claim 1 having the formula $(Tb_{x1}Dy_{1-x1})_1(Co_{y1}Mn_{y2}Fe_{1-y1-y2})_{1.8-2.1}$ wherein $0 \leq x1 \leq 1$, $0 \leq y1 \leq 1$, $0 \leq y2 \leq 0.5$ and $y1+y2 \leq 1$.

13. A material as in claim 1 having the formula $(Tb_{x1}Dy_{1-x2}Ho_{x2})_1(Co_{y1}Mn_{y2}Fe_{1-y1-y2})_{1.8-2.1}$ wherein $0 \leq x1 \leq 1$, $0 \leq x2 \leq 0.5$, $x1+x2 \leq 1$, $0 \leq y1 \leq 1$, $0 \leq y2 \leq 0.5$ and $y1+y2 \leq 1$.

14. A material as in claim 1 an atomic percent of oxygen ranging from 10,000 to 34,000 parts per million, an atomic percent of nitrogen ranging from 1,200 to 4,400 parts per million and an atomic percent carbon ranging from 4,800 to 21,000 parts per million.

15. A rare earth-transition metal magnetostrictive material having the formula $(Tb_xD_{1-x})_1Fe_{1.8-2.1}$ wherein $0 \leq x \leq 1$, the material having a magnetostrictive strain that produces an aligned crystalline or polycrystalline structure to exploit the anisotropy of magnetostriction of the material to yield an optimized macroscopic change in length in response to an applied magnetic field and having an atomic percent of oxygen ranging from 6,011 to 34,000 parts per million, an atomic percent of nitrogen ranging from 575 to 4,400 parts per million and an atomic percent of carbon ranging from 939 to 21,000 parts per million.

16. A material as in claim 15 having an atomic percent of oxygen ranging from 6,011 to 16,000 parts per million, an atomic percent of nitrogen ranging from 575 to 2,000 parts per million and an atomic percent of carbon ranging from 939 to 9,000 parts per million, the material having been prepared by a free standing zone melt method and having a magnetostrictive strain of at least approximately 900 parts per million when a magnetic field of 500 oersteds is applied to the material and the material is under a compressive prestress of 1000 pounds per square inch.

17. A material as in claim 15 having an atomic percent of oxygen ranging from 6,011 to 16,000 parts per million, an atomic percent of nitrogen ranging from 575 to 2,000 parts per million and an atomic percent of carbon ranging from 939 to 9,000 parts per million, the material having been prepared by a Bridgman or modified Bridgman method having a magnetostrictive strain of at least approximately 600 parts per million when a magnetic field of 500 oersteds is applied to the material and the material is under a compressive prestress of 1000 pounds per square inch.

18. A material as in claim 15 having an atomic percent of oxygen ranging from 10,000 to 34,000 parts per million, an atomic percent of nitrogen ranging from 1,200 to 4,400 parts per million and an atomic percent of carbon ranging from 4,800 to 21,000 parts per million.

* * * * *